United States Patent

Cagan et al.

[11] Patent Number: 5,825,660
[45] Date of Patent: Oct. 20, 1998

[54] METHOD OF OPTIMIZING COMPONENT LAYOUT USING A HIERARCHICAL SERIES OF MODELS

[75] Inventors: Jonathan Cagan; Ashish Kolli, both of Pittsburgh, Pa.; Simon Szykman, Gaithersburg, Md.; Robin Rutenbar, Pittsburgh, Pa.

[73] Assignee: Carnegie Mellon University, Pittsburgh, Pa.

[21] Appl. No.: 524,091

[22] Filed: Sep. 7, 1995

[51] Int. Cl.$^6$ ..................................................... G06F 17/50
[52] U.S. Cl. ........................... 364/491; 364/489; 364/578
[58] Field of Search .................................. 364/488, 489, 364/490, 491, 578

[56] References Cited

U.S. PATENT DOCUMENTS

| | | | |
|---|---|---|---|
| 5,249,133 | 9/1993 | Batra | 364/489 |
| 5,381,343 | 1/1995 | Bamji et al. | 364/488 |
| 5,495,419 | 2/1996 | Rostoker et al. | 364/491 |
| 5,513,119 | 4/1996 | Moore et al. | 364/491 |
| 5,519,628 | 5/1996 | Russell et al. | 364/491 |
| 5,557,533 | 9/1996 | Koford et al. | 364/491 |
| 5,604,680 | 2/1997 | Bamji et al. | 364/491 |

FOREIGN PATENT DOCUMENTS

| | | |
|---|---|---|
| A-434051 | 6/1991 | European Pat. Off. . |
| WO-A-9003618 | 4/1990 | WIPO . |

OTHER PUBLICATIONS

M. D. Huang, et al., An Efficient General Cooling Schedule For Simulated Annealing, 1986 IEEE pp. 381–384.

Simon Szykman et al., Automated Generation of Optimally Directed Three Dimensional Component Layouts, pp. 527–537 DE–vol. 65–1 Advances in Design Automation—vol. 1 ASME 1993.

IEEE/ACM International conference On Computer–Aided Design, 7 Nov. 1993, Santa Clara, CA, USA, pp. 164–169, Hyunchul Shin et al. "A Combined Hierarchical Placement Algorithm".

Computer Aided Design, vol. 22, No. 2, Mar. 1990, London, GB, pp. 97–108, Montreuil, Requirements For Representation Of Domain Knowledge In Intelligent Environments For Layout Design.

*Primary Examiner*—Kevin J. Teska
*Assistant Examiner*—Tyrone V. Walker
*Attorney, Agent, or Firm*—Kirkpatrick & Lockhart LLP

[57] ABSTRACT

A method of optimizing a three-dimensional component layout in accordance with predetermined constraints is comprised of the steps of generating a plurality of models for each component. The plurality of models is arranged in a hierarchy from the model having the least resolution to the model having the most resolution. A starting layout is selected for the components. An iterative type of optimization routine is performed wherein each iteration is evaluated for satisfaction of the constraints using models for the components selected according to the level of resolution desired at that time in the iterative process. The optimization routine ends when a predetermined ending criterion is met.

30 Claims, 5 Drawing Sheets

METHOD OF OPTIMIZING COMPONENT LAYOUT USING A HIERARCHICAL SERIES OF MODELS

STATEMENT REGARDING FEDERALLY FUNDED RESEARCH

The invention disclosed herein was made or conceived in the course of or under a contract with the United States Government. The United States Government may have rights in the invention.

BACKGROUND OF THE INVENTION

1. Field of the Invention

The present invention is directed generally to component layout and more particularly to the expansion into three dimensions of component layout problems.

2. Description of the Background

Several research efforts have focused on layout problems that involve locating components in space while satisfying spatial relationships among them. Those spatial relationships consist of a non-interference condition and may also include additional constraints on component placement.

A majority of the research in this area has been done in the field of operations research (OR), focusing primarily on the packing problem. The various OR approaches to packing problems are summarized in a number of survey papers. Packing problems formulations typically do not allow representation of various types of spatial constraints on component placements. For a layout tool to be useful in general engineering applications, representation of these types of constraints is essential.

A variety of optimization techniques have been applied to three dimensional component layout problems. Such approaches have a number of disadvantages associated with the nonlinear nature of layout problems: they either require feasible starting points, linearization of nonlinear equations (which can lead to poor convergence), or require the use of gradients which may be difficult to calculate. In addition, those techniques generally converge to local rather than global optima.

Simulated annealing is a stochastic optimization technique that has been used to solve continuous, ordered, discrete and multi-modal optimization problems. In a typical simulated annealing algorithm, a feasible state is chosen as a starting state and evaluated (i.e., the value of the objective function at that point is calculated). A step is taken to a new design state which is then evaluated. If this step leads to an improvement in the objective function, the new design is accepted and becomes the current design state.

If the step leads to an inferior state, the step may still be accepted with some probability. That probability is a function of a decreasing parameter called temperature, based on an analogy with the annealing of metals. The temperature starts out high and decreases with time. Initially, steps taken through the state space (and therefore the objective function space) are almost random, resulting in a broad exploration of the objective function space. As the probability of accepting inferior steps decreases, those steps tend to get rejected, allowing the algorithm to converge to an optimum once promising areas of the objective function space have been found.

The simulated annealing technology is well established beyond the academic research community and is used extensively for circuit layout in industry. One reason for the success of the simulated annealing algorithm is that it does not share the drawbacks described above. In particular, simulated annealing can escape from local optima and is a zero-order algorithm that does not require the use of gradients. However, because VLSI circuits are generally modeled using multiple two dimensional or planar circuits, the need to extend that technology to three dimensions has not arisen in the domain of circuit layout. In contrast, the third dimension usually cannot be neglected for component layout problems in mechanical engineering applications. Thus, the need exists for a method to extend the use of simulated annealing and other optimization techniques to practical three dimensional layout problems.

SUMMARY OF THE INVENTION

The present invention, in its broadest sense, is directed to a method of optimizing component layout in accordance with predetermined constraints. The method is comprised of the steps of generating a plurality of models for each component. The plurality of models is arranged in a hierarchy from the model having the least resolution to the model having the most resolution. A starting layout is selected for the components. An iterative type of optimization routine is performed wherein each iteration is evaluated for satisfaction of the constraints using models for the components selected according to the level of resolution desired at that time in the iterative process. The optimization routine ends when a predetermined ending criterion is met.

According to one embodiment of the present invention, the plurality of models is generated using an octree representation. The octree representation provides a number of levels with the resolution of each level increasing from the root node.

According to another embodiment of the present invention, the octree representation is used in conjunction with a simulated annealing optimization program. When the temperature is high, large component moves may be made and the models needed to evaluate the layout are selected from the octree such that low resolution models are selected. However, as the temperature decreases, smaller component moves are made and higher resolution models are selected from the octree to perform the necessary evaluation. By recognizing that detailed analyses need not be made early on in the process, and that layout changes in the later stages are likely to be smaller, the present invention may be implemented in software in which tens or hundreds of thousands of iterations can be run in a matter of minutes. The present invention enables complicated three-dimensional layout problems to be solved according to constraints provided by domain engineers. Those and other advantages and benefits of the present invention will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
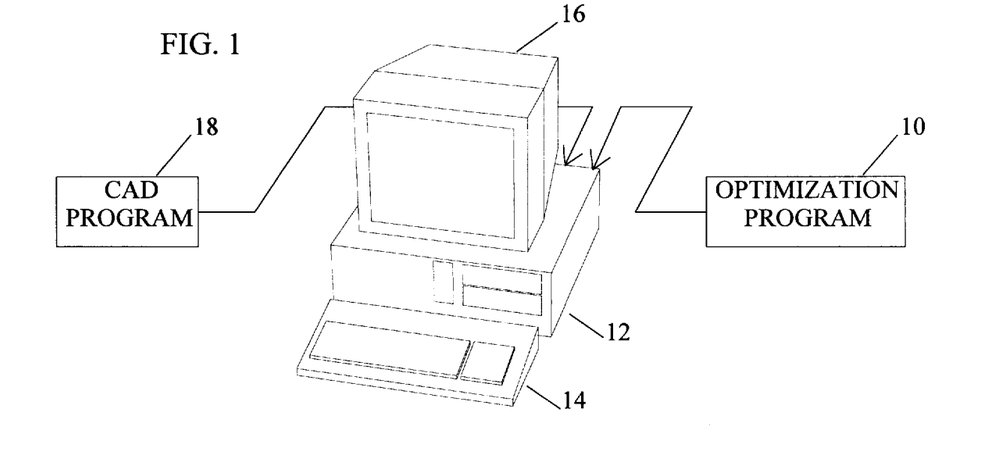
FIG. 1 illustrates a hardware platform on which the method of the present invention may be practiced.

The present invention is directed to a method of optimizing three dimensional component layout problems using a hierarchical series of models. In the preferred embodiment, the method is embodied in computer software 10 illustrated in FIG. 1. The optimization program 10 of the present invention may be resident on a commercially available computer 12 which has connected to it a conventional keyboard 14 and monitor 16. The computer 12 may also have stored thereon any of a number of commercially available CAD programs 18.

Figure 2:
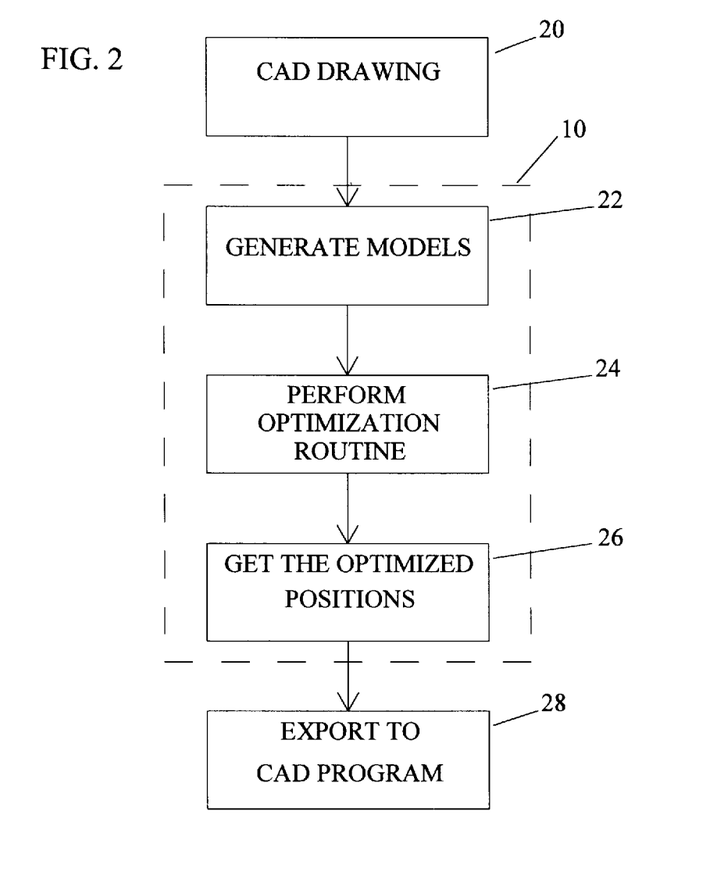
FIG. 2 is a high level block diagram illustrating the steps of the method of the present invention.

A high level block diagram illustrating the steps of the method embodied within computer software 10 is illustrated in FIG. 2. In FIG. 2, at step 20, the CAD program 18 is used to provide a drawing of each of the components within a layout which is to be optimized. The term layout as used herein is used in its broadest sense. For example, by applying constraints, such as fitting within a given volume, no overlap of components, and spatial constraints, the layout of the components within an engine compartment or the layout of the components comprising a water pumping station can be optimized. If the constraints applied are to maximize density and fit within a given volume with no overlap of components, then any number of three dimensional packing problems can be solved.

After the CAD program 18 has constructed drawings of each of the components, the drawings are exported from CAD program 18 to the optimization program 10. At step 22, the optimization program 10 generates a plurality of models for each component as will be described in greater detail hereinbelow. The plurality of models is arranged in a hierarchy ranging from the least resolution to the most resolution. The particular method of generating the hierarchy of models used in the present invention is based on octrees of the type used, for example, in robotics research for interference detection, although other methods of generating such models could be used.

Once the hierarchy of models has been generated, an iterative type of optimization routine is performed at step 24. The particular optimization routine described hereinbelow is based on principles of simulated annealing, although other types of iterative optimization routines could be used. In performing the optimization routine, early in the routine, large movements are being made such that only gross analyses need to be performed to determine whether the layout meets the constraints. Therefore, at that level, low resolution models are used. As the routine progresses, the moves generally become smaller thereby requiring the use of more detailed models for performing more detailed analyses. To achieve that goal using a simulated annealing optimization routine, each temperature is linked to a level of resolution such that an appropriate model may be selected for conducting the analysis primarily based on the temperature. Whatever type of optimization routine is used, it is necessary to evaluate the satisfaction of the constraints only at a desired level of resolution appropriate for the types of moves generally being made, and no greater. After the optimization routine is completed, the optimized positions for each of the components are obtained at step 26 and exported to the CAD program at step 28.

Figure 3:
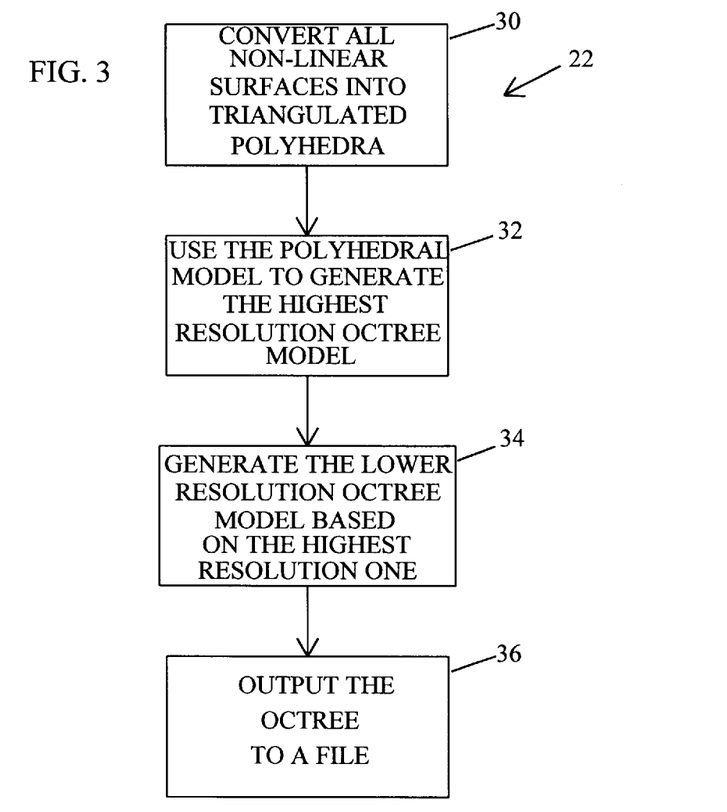
FIG. 3 is a high level block diagram illustrating the steps for creating a hierarchical series of models.

The step 22 of generating models in FIG. 2 is illustrated in greater detail in FIG. 3. The generation of the octree begins with the boundary representations of each component as represented by the CAD drawings produced by CAD program 18. In the boundary representation, an object is represented in terms of its faces. Those faces can be linear or non-linear surfaces. The first step, step 30, is to convert the object into a faceted polyhedron by triangulating each of the faces using, for example, the standard Delauney Triangulation scheme. At step 32, the polyhedron model is used to generate the highest resolution octree model corresponding to the minimum tolerance required by the user. At step 34, once the highest resolution octree model is generated, all of the lower resolution octree models can be generated therefrom. Thereafter, the octree models can be output to a file so that the models can be retrieved as needed in the future.

Figure 4A:
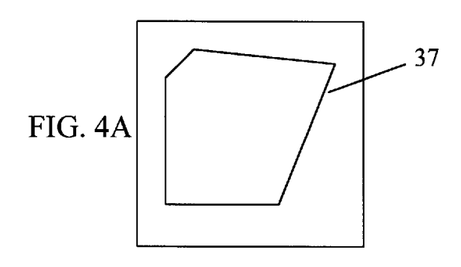
FIGS. 4a through 4d illustrate the hierarchical decomposition of an article at four different levels of resolution.
Figure 4B:
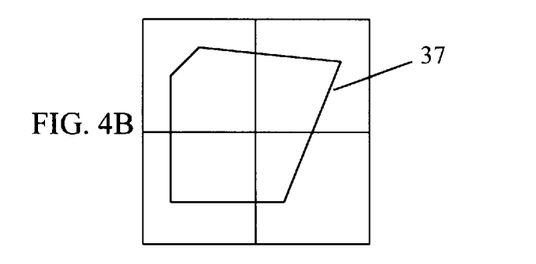
Figure 4C:
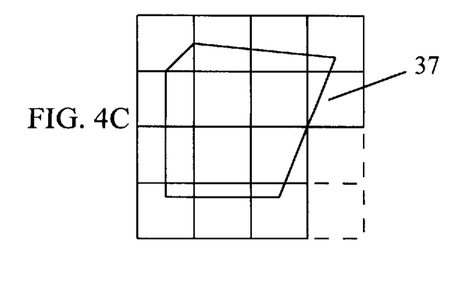
Figure 4D:
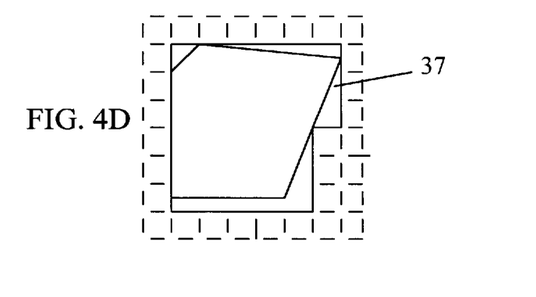

Octrees, like binary trees, can be used to localize the search during spatial queries to only those sub-spaces that are relevant. Viewed from another perspective, the octree provides a set of multi-resolution models for an arbitrarily shaped three-dimensional object at almost no real-time computational expense. For example, the top level (root node) of an octree can be considered as the simplest approximation of a complex shape that it bounds. As we go down each level of the octree, we get a better approximation of the object. FIG. 4a illustrates that concept wherein a two-dimensional object 37 is first represented as a single box. In FIG. 4b, that box is decomposed into four boxes, each of which represent the object 37. In FIG. 4c the object 37 is decomposed into sixteen boxes, fourteen of which represent the object 37 and three of which are totally enclosed by the object 37. Finally, in FIG. 4d, the object 37 is further decomposed into sixty-four boxes, thirty-three of which represent the object 37 and eighteen of which are totally enclosed by the object 37. As the decomposition continues, the representation of the object 37 becomes more accurate. The decomposition can be made off-line and stored with the object 37. As discussed below in conjunction with FIG. 7, the decomposition is used to perform intersection tests at various levels of accuracy.

Figure 5:
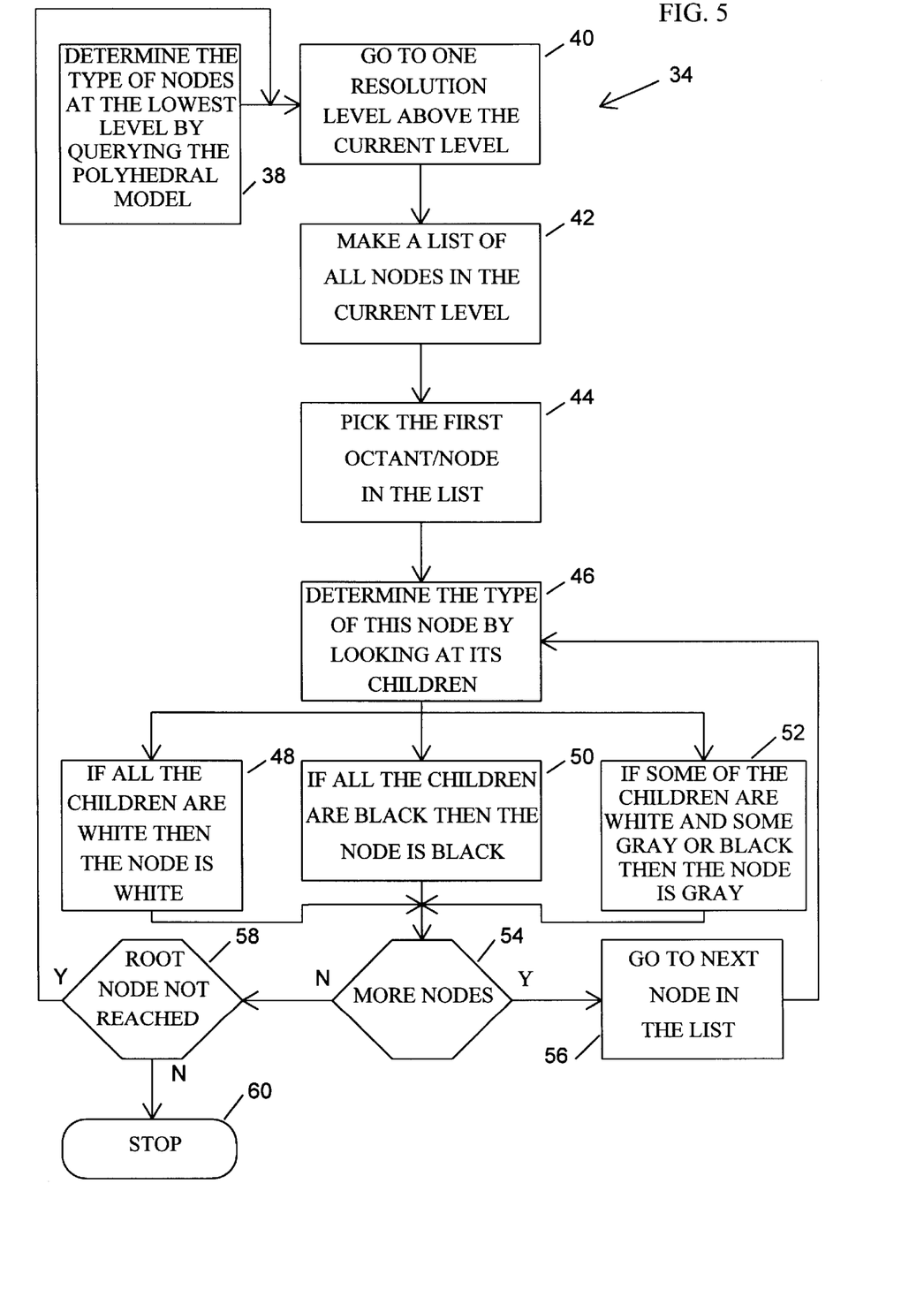
FIG. 5 is a block diagram illustrating the steps for generating lower resolution models based on the highest resolution model.

The step 34 of FIG. 3 of generating the lower level models is illustrated in detail in FIG. 5. In FIG. 5, at step 38, the type of nodes at the lowest level are determined by querying the polyhedral model. In the next step, step 40, the analysis progresses to one resolution level above the current level. At step 42, a list of all nodes in the current level is made. In step 44, the first octant/node in the list is picked. At step 46, the type of node is determined by looking at the node's children, i.e., nodes that depend from it. A node is considered to be white if it is completely empty, black if it is fully occupied, and gray if it is partially occupied. By looking at the node's children, if all the children are white, then the node is classified as white in step 48. Conversely, if all the children are black, then the node is classified as black in step 50. If some of the children are white and some of the children are gray or black, then the node is classified as gray in step 52.

At the end of step 52, two decision steps are provided. In the first decision step 54, a decision is made whether there are more nodes available for classification. If the answer is yes, the next node in the list is retrieved at step 56 and process control returns to step 46. If the answer is no, a decision is made at step 58 whether a root node has not been reached. If the root node has not been reached, then process control returns to step 40. If the root node has been reached, then the process concludes at step 60.

The octree models can be generated off-line and stored. The other information which needs to be available before the optimization method of the present invention can be performed is to define the constraints for the layout. The constraint will normally be defined by the domain engineer. The constraints may be spatial in nature, structural, or any other type of constraint which the domain engineer determines must be satisfied. The generation of the constraints is not an important feature of the invention. It is necessary to have constraints for layout, but the particular method for creating the constraints is not relevant to the present invention. Accordingly, the following paragraph discussing spatial constraints is intended to be illustrative of the type of constraints with which the present invention may be used.

A variety of spatial constraints can be applied through the current embodiment of the invention. The most simple type, called unilateral constraints, restrict a single degree-of-freedom of a component. Examples include constraining the center of a component to lie on a plane or the rotation of an object within a cone. The next type of constraint are bilateral constraints that bind degrees-of-freedom of one object to another. Examples are fixing the relative orientations of various components to be the same or imposing that certain components always be above or below other components, such as the fan of an automobile must always be aligned along the shaft of the engine. Another type of constraint is a proximity constraint (i.e., "near" or "far") which governs the relative separation between two objects. One instance of these type of constraints can be found in Szykman and Cagan, "Constrained Three Dimensional Component Layout Using Simulated Annealing", DE-Vol. 74, Concurrent Product Design, ASME International Mechanical Engineering Congress and Exposition, p. 175–184 (1994).

Figure 6:
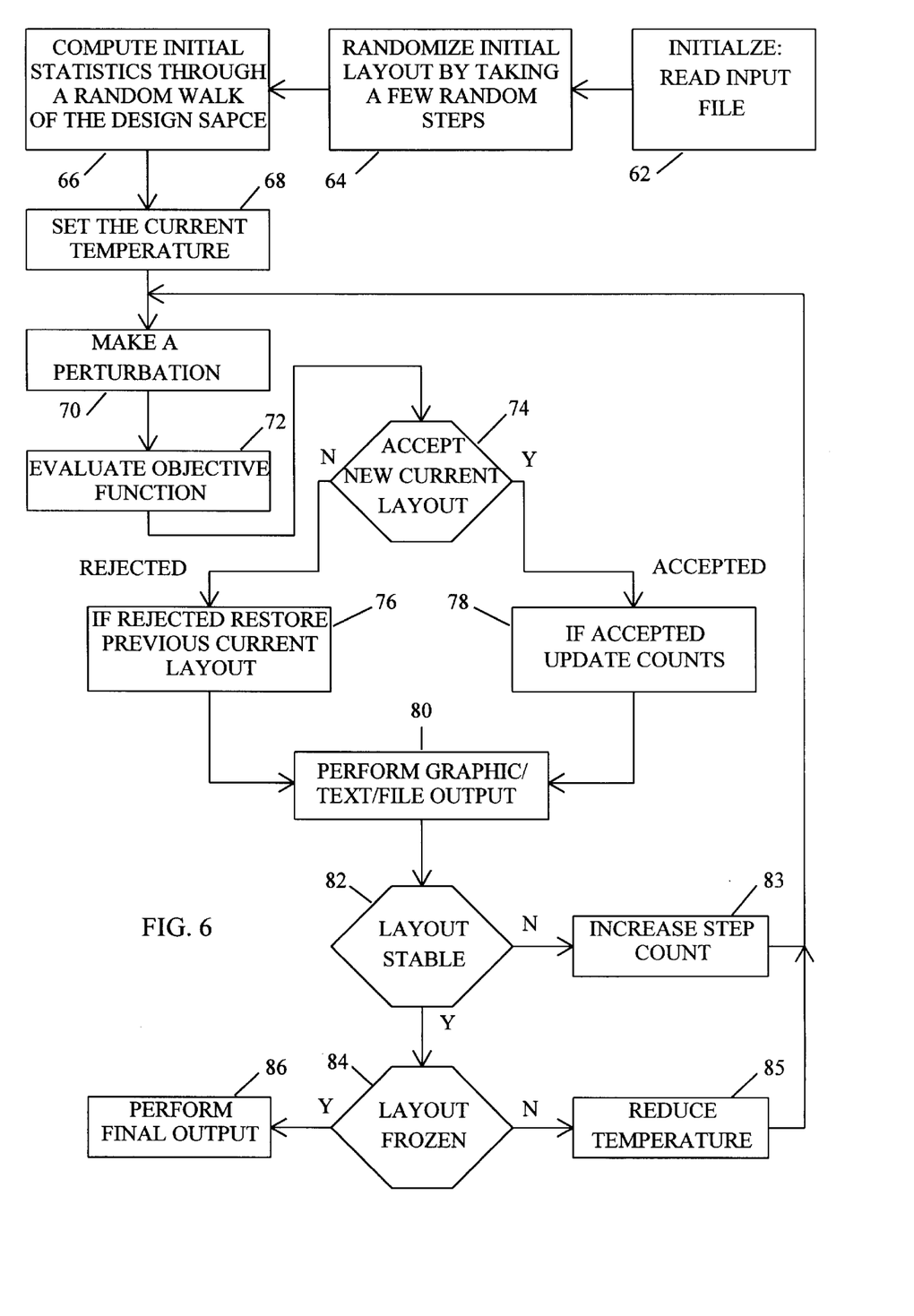
FIG. 6 is a block diagram illustrating the steps of an iterative type optimization routine.

Turning now to FIG. 6, a block diagram illustrating the steps of an iterative type of optimization routine embodied by the present invention is illustrated. At step 62, the routine is initialized by reading an input file. As part of that initialization, the constraints appropriate to the problem to be solved may be retrieved from a file. In step 64, the initial configuration of the components is randomized by, for example, taking a few random steps. Thereafter, in step 66, initial statistics are computed through a random walk of the design space. Based on those statistics, a current temperature is set at step 68. The steps 62 through 68 are known in the art and are implemented for the purpose of ensuring that the optimization routine preferably begins with a component layout which is random and a temperature which is appropriate to the component layout.

At step 70, a perturbation is made to the layout. The perturbation may take the form of moving one of the components in the component layout to a new position. The component is moved according to an available moveset such as translate, rotate, or swap. Each of the moves in the moveset has a value associated with it which determines how large the move is, i.e., rotate five degrees, rotate ten degrees, etc. A table is maintained which identifies for each of the moves, the available sizes for each of the moves, the resolution model associated with that size of a move, as well as a count indicating how often that size move resulted in an acceptable layout. The following table illustrates that information.

TABLE 1

| 8 | 7 | 6 | 5 | 4 | 3 | 2 | 1 | resolution |
|---|---|---|---|---|---|---|---|---|
| 3 | .4 | .5 | .6 | .7 | .8 | .9 | 1.0 | move size |
| 100 | 1000 | 50 | 0 | 600 | 150 | 25 | 350 | count |

The move that is picked in step 70 may be picked according to any known prior art technique. The size of the move that is permitted is related to the temperature, with larger moves being gradually eliminated as the temperature decreases. The new current layout which results from the move is then evaluated at step 72. The evaluation is carried out in a manner which determines the value of the design goals and whether the constraints are satisfied or violated. To determine whether the constraints are satisfied or violated, it is necessary to perform the analysis at a given level of detail. The level of analysis is determined by examining the resolution associated with the move in conjunction with the resolution associated with the temperature. The following rules are one way that the appropriate models may be selected:

If temp. resolution level<move resolution level,
  then resolution level=temp. resolution level,
Else if temp. resolution level>move resolution level,
If temp. resolution level≧max. resolution level,
  then resolution level=max. resolution level,
else resolution level=(temp. resolution level+move resolution level)/2

Once the appropriate resolution level has been selected, the models associated with that level are retrieved from the octree file and are used to evaluate the objective function as will be described in further detail hereinbelow. When the temperature is high and large changes are being made, e.g. 1.0 magnitude changes as shown in Table 1, then resolution models, e.g. resolution level 1 in Table 1, are used in the analysis. That is because at that time a detailed analysis is not needed. However, as the temperature decreases, small moves are made which require a detailed analysis thus necessitating the use of highly detailed models. The trade-off in computational time versus accuracy has been found to be quite acceptable because accuracy is sacrificed only when the temperature is high and gross analyses will suffice. Furthermore, even when the more detailed analyses must be performed, there is little computational time required because the scope of the search space is quite small.

A critical part of the objective function is to minimize the volume of intersection of components. That is accomplished by penalizing the objective function for overlap constraint violations. To determine if that constraint is being violated, it is necessary to determine the amount of overlap between components. One method of determining the amount of overlap is set forth in FIG. 7. Thus, steps of FIG. 7 may be part of the "evaluate objective function" step 72 of FIG. 6. As previously mentioned, the evaluation is carried out to determine primarily if there is intersection of components, and if so, what is the volume of intersection at the desired level of resolution. The process begins at step 88 when a check is made to determine if the global bounding boxes of the components intersect. If they do not, then the volume of intersection is zero as shown by step 90. If the global bounding boxes intersect, a check is made at step 92 to determine if the local bounding boxes of the components intersect. If they do not intersect, the volume of intersection is zero as shown by step 90. If they do intersect, at step 94 the octree hierarchy of the components is used to reduce the search space for possible intersection detection. The models of the components are selected from the desired level of the octree.

Figure 7:
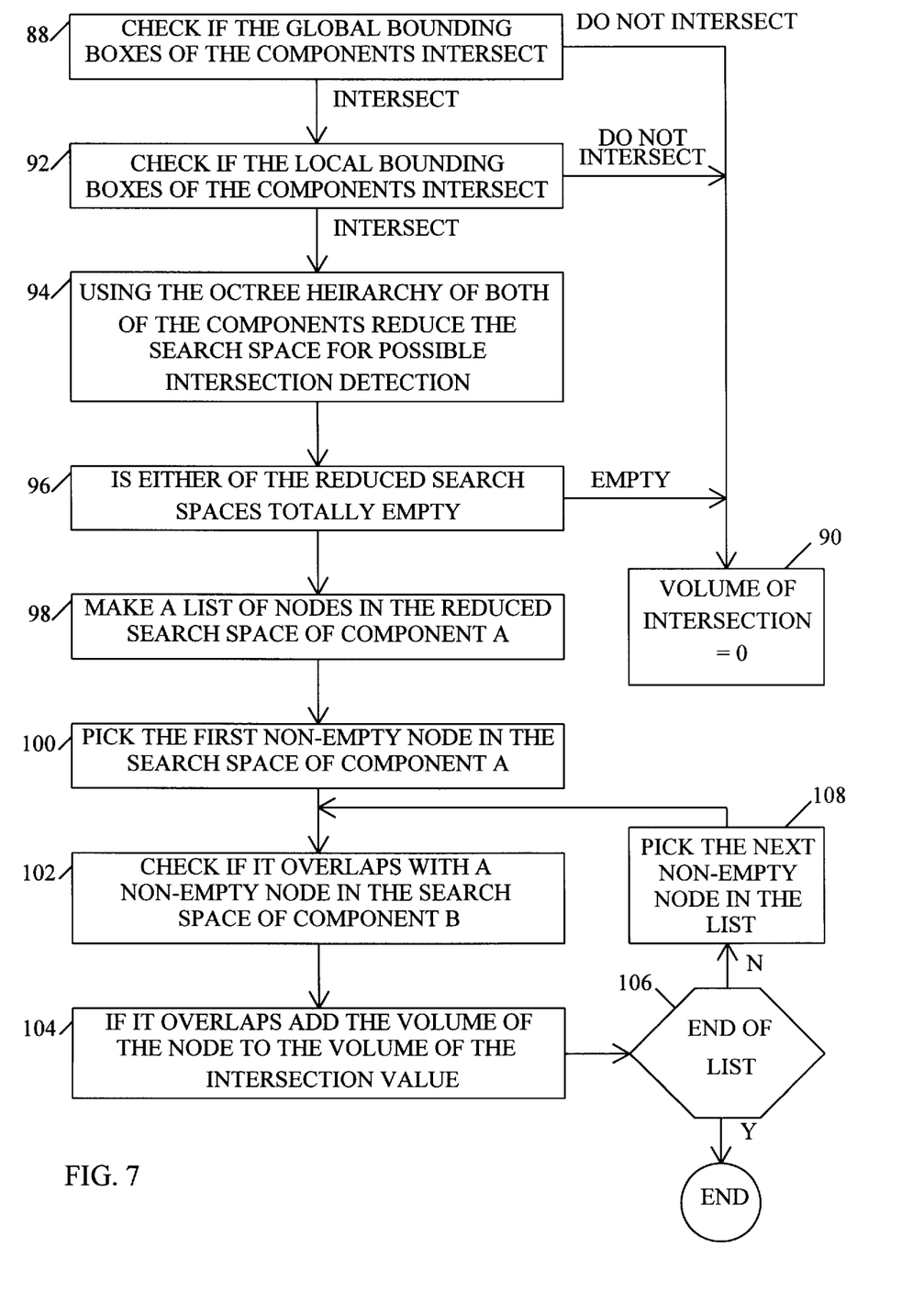
FIG. 7 is a block diagram illustrating the steps for evaluating the volume of intersection between two components.

At step 96, a determination is made if either of the reduced search spaces for either of the components is totally empty. If either is empty, then the volume of intersection is zero as shown by step 90. If both of the reduced search spaces are not totally empty, a list of the nodes in one of the reduced search spaces, e.g. a list of the nodes of component A, is made at step 98. At step 100, the first non-empty node in the search space of component A is selected. At step 102, a check is made to determine if the non-empty node of component A overlaps with a known non-empty node in the search space of component B. At step 104, if the nodes overlap, the volume of the overlapping node is added to the volume of the intersection. At step 106, a decision is made if there are any more nodes to be examined. If not, the process ends. If more nodes exist, the next non-empty node in the search space of component A is selected at step 108 and the process returns to step 102 until the criterion of decision step 106 is met.

Returning to FIG. 6, step 72, minimizing the component overlap is one part of the objective function. Other parts of the objective function can include maximizing the component density, minimizing container violations, minimizing spatial constraint violations, minimizing other constraint violations, and minimizing other design goals. To allow designers to incorporate a variety of design objectives, a generic objective function, F, consisting of a weighted sum of the form:

$$F = W_1 C_1 f_1 + W_2 C_2 f_2 + \ldots + W_n C_n f_n,$$

may be used where $f_i$ is the value of the ith objective, $C_i$ is the ith normalizing coefficient, and $W_i$ is the weight for the ith term. To avoid scaling problems between objective terms that differ greatly in order of magnitude, each of the terms, $f_i$, is multiplied by a coefficient, $C_i$. The value of $C_i$ is one divided by the maximum value of $f_i$ seen at the current temperature, which keeps values of the $C_i f_i$ terms between zero and one. Once the objective function terms are scaled using the coefficients, the weights, $W_i$, allow the user to specify their relative importance.

After the objective function has been evaluated, a decision is made at decision step 74 whether to accept or reject the new current layout. If the new current layout is rejected, then the previous current layout is restored at step 76. If the new current layout is accepted, then the counts as shown in Table 1 are updated to indicated that the move or perturbation has resulted in an acceptable layout. The decision with respect to whether to accept or reject the new current layout is based upon a probability function which is well know in the art of simulated annealing.

At step 80, various information may be output. For example, a graphical illustration of the new current layout may be output as a snapshot of the progress of the optimization method. Thereafter, decision steps, steps 82 and 84, are used to impose a stopping or ending criteria on the routine. At step 82, a determination is made with respect to whether the layout is stable. If the layout is not stable, according to known methods of calculating standard deviations, then a step count is increased at step 83 and process control returns to step 70. If the layout is stable, a determination is made at step 84 whether the layout is frozen, i.e., the lowest temperature has been reached. If the layout is not frozen, the temperature is reduced at step 85 and process control returns to step 70.

During trial runs of the method of the present invention, components have been translated and rotated within a container on the order of one hundred thousand times. In each iteration, or move, an analysis is performed to determine if the constraints are violated. Prior art intersection tests with geometric modeling systems are too costly in terms of time. Assuming that each set of tests per iteration took 0.5 seconds, it would require approximately fourteen hours just to perform the intersection tests. This embodiment of the present invention takes advantage of two properties of simulated annealing. At high temperatures, early in the routine, the routine is essentially moving components randomly while at lower temperatures, toward the end of the routine, the routine is making small moves. Thus, at high temperatures, only a rough approximation of constraint violations is needed and the higher levels of the octree are used such that constraint violations are based on cuboids or quarter cuboids. As the routine progresses, the representation moves down the levels of the octree until the very end where the most detailed octree is used. However, because the routine dictates making small, localized moves, only a limited amount of analysis is required to determine the change in constraint violations. As a result, the method of the present invention can be run to approximately one hundred thousand iterations in the order of minutes instead of hours. Depending upon the constraints developed by the domain engineer, the method of the present invention can be used to solve such three dimensional problems as optimizing the layout of components within an automobile engine compartment, optimizing the layout of small consumer electronics, optimizing the packing of a shipping container, etc.

The present invention has been described in connection with preferred embodiments thereof. Those of ordinary skill in the art will recognize that many modifications and variations may be employed. For example, other iterative types of optimization routines may be utilized as well as other types of modeling techniques. All such modifications and variations are intended to be covered by the foregoing description and the following claims.

What is claimed is:

1. A method of optimizing component layout in accordance with predetermined constraints, comprising:
   generating a plurality of models for each said component of said layout, said plurality of models being arranged in a hierarchy from a simple approximation of said component shape to a more accurate approximation of said component shape;
   selecting a starting layout for the said components;
   performing an iterative type of optimization routine wherein each iteration includes moving at least one said component and evaluating the resulting layout for satisfaction of said predetermined constraints using a model for each said component selected from said plurality of models according to the level of approximation desired; and
   ending the optimization routine when said predetermined constraint is met.

2. The method of claim 1 wherein the step of performing an iterative type of optimization routine includes the step of performing a simulated annealing routine, and wherein a temperature associated with the simulated annealing routine determines the level of approximation desired.

3. The method of claim 1 wherein the step of generating a plurality of models includes the step of generating a plurality of models using an octree representation.

4. The method of claim 2 wherein the level of approximation desired is determined based on the temperature and the magnitude of the move selected.

5. The method of claim 1 wherein the step of moving at least one of the components includes the step of selecting a move from a moveset.

6. The method of claim 5 wherein the step of moving at least one of the components includes the step of selecting a magnitude for the move selected from the moveset.

7. The method of claim 4 wherein the temperature has a level of approximation associated therewith and the magnitude of the move has a level of approximation associated therewith, and wherein the level of approximation desired is determined by the following ruleset:

if the temperature approximation level is less than the move approximation level, then the level of approximation desired is the temperature approximation level, if the temperature approximation level is greater than or equal to the maximum approximation level, then the level of approximation desired is the maximum approximation level, and if the temperature approximation level is greater than the move approximation level, then the level of approximation desired is a combination of the two approximation levels.

8. The method of claim 6, additionally comprising the step of incrementing a count associated with each magnitude of each move whenever that magnitude produces a layout which is accepted.

9. A method of optimizing component layout in accordance with predetermined constraints, comprising:

(a) generating a plurality of models for each said component, said plurality of models being arranged in a hierarchy from a simple approximation of said component shape to a more accurate approximation of said component shape;

(b) associating each level of approximation with the moves of a moveset;

(c) selecting a current layout for the said components;

(d) moving one of the said components to create a new current layout;

(e) selecting a model for each said component from said plurality of models based on the level of approximation desired and a move selected from the moveset;

(f) evaluating the new current layout using the selected models and the predetermined constraints;

(g) determining whether to accept the new current layout; and (h) repeating steps (d) through (h) until said predetermined constraint is satisfied.

10. The method of claim 9 wherein the plurality of models is generated using an octree representation.

11. The method of claim 10 wherein the plurality of models is generated by converting all non-linear surfaces of each component into triangulated polyhedra, and wherein the highest approximation model of each component is generated from the polyhedral model, and wherein all the lower approximation models of each component are generated from the highest approximation model.

12. The method of claim 11 wherein the lower approximation models are generated from the higher approximation models by examining the children of each node at each level in the octree.

13. The method of claim 9 wherein the step of evaluating the new current layout includes the step of determining the volume of overlap between components of the new current layout.

14. The method of claim 9 wherein steps (c) through (h) are part of a simulated annealing routine.

15. The method of claim 14 wherein the predetermined end criterion is satisfied when the layout has stabilized at a lowest temperature associated with the simulated annealing routine.

16. A method of optimizing a three-dimensional component layout in accordance with predetermined constraints, comprising the steps of:

generating a plurality of models for each said component using an octree representation of said layout said models arranged in a hierarchy from a simple approximation of said component shape to a more accurate approximation of said component shape, and wherein each approximation level is related to a temperature;

initializing the said components and a starting temperature; and performing a simulated annealing optimization routine comprised of a series of iterations which reduce the starting temperature to a final temperature, and wherein the layout at each iteration is evaluated for satisfaction of said predetermined constrains according to models selected on the basis of the then current temperature.

17. The method of claim 16 wherein the models selected progress generally from low approximation models at the beginning of the optimization routine to high approximation models near the end of the optimization routine.

18. A method of optimizing component layout in accordance with predetermined constraints, comprising the steps of:

generating a plurality of models for each said component using an octree representation, said plurality of models being arranged in a hierarchy from a simple approximation of said component shape to a more accurate approximation of said component shape;

selecting a starting layout for the said components;

performing an iterative type of optimization routine wherein each iteration is evaluated for satisfaction of predetermined constraints using models for each said component selected according to the level of approximation desired; and ending the optimization routine when a predetermined constraint is met.

19. The method of claim 18 wherein the step of performing an iterative type of optimization routine includes the step of performing a simulated annealing routine, and wherein the temperature determines the level of approximation desired.

20. The method of claim 19 wherein the step of performing a simulated annealing routine includes the step of moving at least one of the components per iteration, and wherein the level of approximation desired is determined based on the temperature and the move selected.

21. The method of claim 20 wherein the step of moving at least one of the components includes the step of selecting a move from a moveset.

22. The method of claim 21 wherein the step of moving at least one of the components includes the step of selecting a magnitude for the move selected from the moveset.

23. The method of claim 21 wherein the temperature has a level of approximation associated therewith and the magnitude of the move has a level of approximation associated therewith, and wherein the level of approximation desired is determined by the following ruleset:

if the temperature approximation level is less than the move approximation level, then the approximation desired is the temperature approximation level, if the temperature approximation level is greater than or equal to the maximum approximation level, then the level of approximation desired is the maximum approximation level, and if the temperature approximation level is greater than the move approximation level, then the level of approximation desired is a combination of the two approximation levels.

24. The method of claim 22, additionally comprising the step of incrementing a count associated with each magnitude of each move whenever that magnitude produces a layout which is accepted.

25. A method of optimizing component layout in accordance with predetermined constraints, comprising the steps of:

(a) generating a plurality of models for each said component of said layout using an octree representation, said plurality of models being arranged in a hierarchy ranging from a simple approximation of said component shape to a more accurate approximation of said component shape;

(b) selecting a current layout for the said components;

(c) moving one of the said components to create a new current layout;

(d) selecting a model for each said component from said plurality of models based on the level of approximation desired;

(e) evaluating the new current layout using the selected models and the predetermined constraints;

(f) determining whether to accept the new current layout; and (g) repeating steps (c) through (g) until a predetermined constraint is satisfied.

26. The method of claim 25 wherein the plurality of models is generated by converting all non-linear surfaces of each component into triangulated polyhedra, and wherein the highest approximation model of each component is generated from the polyhedral model, and wherein all the lower approximation models of each component are generated from the highest approximation model.

27. The method of claim 26 wherein the lower approximation models are generated from the higher approximation models by examining the children of each node at each level in the octree.

28. The method of claim 25 wherein the step of evaluating the new current layout includes the step of determining the volume of overlap between components of the new current layout.

29. The method of claim 25 wherein steps (b) through (g) include being part of a simulated annealing routine.

30. The method of claim 29 wherein the predetermined constraint is satisfied when the layout has stabilized at the lowest temperature.

* * * * *

UNITED STATES PATENT AND TRADEMARK OFFICE
CERTIFICATE OF CORRECTION

PATENT NO.    : 5,825,660
DATED         : October 20, 1998
INVENTOR(S)   : Cagan et al.

It is certified that error appears in the above-identified patent and that said Letters Patent is hereby corrected as shown below:

<u>Column 10,</u>
Line 2, delete "using an octree representation of said layout" and substitute therefor -- of said layout using an octree reprentation, --;
Line 13, delete "constrains" and substitute therefor -- constraints --; and
Line 51, delete "21" and substitute therefor -- 22 --.

Signed and Sealed this

Twenty-sixth Day of February, 2002

Attest:

JAMES E. ROGAN
*Attesting Officer*     *Director of the United States Patent and Trademark Office*